(12) United States Patent
Cao et al.

(10) Patent No.: US 10,798,814 B2
(45) Date of Patent: Oct. 6, 2020

(54) SIP MODULE AND MANUFACTURING METHOD OF THE SIP MODULE

(71) Applicant: UNIVERSAL SCIENTIFIC INDUSTRIAL (SHANGHAI) CO., LTD., Shanghai (CN)

(72) Inventors: Jing Cao, Shanghai (CN); Weng-Khoon Mong, Shanghai (CN); Dong-Feng Ling, Shanghai (CN)

(73) Assignee: UNIVERSAL SCIENTIFIC INDUSTRIAL (SHANGHAI) CO., LTD., Shanghai (CN)

(*) Notice: Subject to any disclaimer, the term of this patent is extended or adjusted under 35 U.S.C. 154(b) by 0 days.

(21) Appl. No.: 16/207,835

(22) Filed: Dec. 3, 2018

(65) Prior Publication Data

US 2019/0387610 A1    Dec. 19, 2019

(30) Foreign Application Priority Data

Jun. 14, 2018   (CN) .......................... 2018 1 0614056

(51) Int. Cl.
*H05K 5/06*    (2006.01)
*H05K 9/00*    (2006.01)
(Continued)

(52) U.S. Cl.
CPC .......... *H05K 1/0216* (2013.01); *H05K 1/181* (2013.01); *H05K 3/0052* (2013.01); *H05K 3/28* (2013.01);
(Continued)

(58) Field of Classification Search
CPC .. H05K 1/0216; H05K 9/0084; H05K 9/0007; H05K 5/065; H05K 3/328;
(Continued)

(56) References Cited

U.S. PATENT DOCUMENTS 7,514,769 B1 * 4/2009 Mostafazadeh ....... H01L 21/561
                                                              257/678
8,039,930 B2   10/2011 Liao et al.
(Continued)

FOREIGN PATENT DOCUMENTS

CN    105810666 A    7/2016
CN    106465568 A    2/2017
(Continued)

*Primary Examiner* — Rockshana D Chowdhury
(74) *Attorney, Agent, or Firm* — Li & Cai Intellectual Property (USA) Office

(57) ABSTRACT

A method of manufacturing a System in Package (SiP) module includes: welding required electronic units by the SiP module onto a top surface of a Printed Circuit Board (PCB), with welding spots being reserved on a bottom surface of the PCB for obtaining a PCB assembly (PCBA) of the SiP module; pasting tightly a functional film on a surface of the electronic units of the PCBA; filling on plastic materials on the top surface of the PCBA, ensuring that the plastic materials covers the electronic units and the functional film on the top surface of the PCBA, and obtaining solidified PCBA after the plastic materials are solidified; and cutting the solidified PCBA for obtaining a plurality of the SiP modules.

6 Claims, 6 Drawing Sheets

8a

8b

(51) Int. Cl.
*H05K 1/02* (2006.01)
*H05K 3/32* (2006.01)
*H05K 3/28* (2006.01)
*H05K 3/00* (2006.01)
*H05K 1/18* (2006.01)

(52) U.S. Cl.
CPC ............ *H05K 3/284* (2013.01); *H05K 3/328* (2013.01); *H05K 5/065* (2013.01); *H05K 9/0007* (2013.01); *H05K 9/0084* (2013.01); *H05K 2201/10522* (2013.01); *H05K 2203/0278* (2013.01); *H05K 2203/1316* (2013.01); *H05K 2203/1322* (2013.01); *H05K 2203/1327* (2013.01)

(58) Field of Classification Search
CPC ........ H05K 3/284; H05K 3/28; H05K 3/0052; H05K 1/181; H05K 2203/1327; H05K 2203/1322; H05K 2203/1316; H05K 2203/0278; H05K 2201/10522; H05K 1/186; H05K 1/0224; H05K 3/281; H05K 2203/0759; H05K 2203/1311; H05K 2201/0715; H05K 3/34; H05K 1/18; H01L 23/12
See application file for complete search history.

(56) References Cited

U.S. PATENT DOCUMENTS

2018/0061806 A1\* 3/2018 Jung ...................... H01L 24/16
2018/0323128 A1\* 11/2018 Dias ................... H01L 25/0657
2019/0035744 A1\* 1/2019 Kawabata ............ H01L 23/552
2019/0206779 A1\* 7/2019 Murtuza ................ H05K 1/111

FOREIGN PATENT DOCUMENTS

| JP | 2010109274 A | | 5/2010 |
|----|----|----|----|
| JP | 2011124413 A | | 6/2011 |
| JP | 2011138963 A | | 7/2011 |
| JP | 2012159935 A | | 8/2012 |
| JP | 2012160572 A | | 8/2012 |
| JP | 2014107372 A | | 6/2014 |
| JP | 2015115559 A | | 6/2015 |
| JP | 2015221499 A | \* | 12/2015 |
| JP | 2017143210 A | | 8/2017 |
| KR | 1020120133119 A | | 12/2012 |
| KR | 1020150140340 A | | 12/2015 |
| KR | 1020180009301 A | | 1/2018 |
| TW | M527127 U | | 8/2016 |
| WO | 2019026902 A1 | | 2/2019 |

\* cited by examiner

4a

4b

4c

5a

5b

5c

US 10,798,814 B2

SIP MODULE AND MANUFACTURING METHOD OF THE SIP MODULE

CROSS-REFERENCE TO RELATED PATENT APPLICATION

This application claims the benefit of priority to China Patent Application No. 201810614056.4, filed on Jun. 14, 2018 in People's Republic of China. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a system in package (SiP) module; more particularly, to a manufacturing method of the SiP module.

BACKGROUND OF THE DISCLOSURE

Currently, electronic products in the field of communication are made smaller with more integrated functions. As a result, spacings between internal electronic elements of the electronic products are smaller than before. In actual practice, a plastic sealing technique is required to be implemented onto the electronic elements in order to solidify a connection between the electronic elements and a printed circuit board (PCB) for preventing entry of external dust into the electronics elements so as to avoid electricity leakage and interference among the electronic elements.

Current manufacturing process of the thermoplastic sealing applies the surface mount technology (SMT) on a surface of the PCB to produce a printed circuit board assembly (PCBA), filling on plastic materials on a top surface of the PCBA to form a molding layer, and cutting the PCBA after the PCBA is solidified so as to obtain a system in package (SiP) module, in which no other subsidiary films or materials are attached upon electronic units that are mounted on the PCB. Electromagnetic shielding is implemented typically by sputtering a metal layer to form a film or by attaching the film onto the SiP module after the aforesaid plastic sealing, thereby achieving the effect of electromagnetic protection.

However, with the rapid development of the electronic industry, electromagnetic protection requirements have risen. Implementing the electromagnetic shielding (sputtering to form the film or attaching the film) process after the aforesaid plastic sealing can only achieve the effect of shielding the single band electromagnetic wave, but not the multi-band electromagnetic wave. Moreover, a binding force is difficult to be controlled when sputtering to form the film.

SUMMARY OF THE DISCLOSURE

In response to the above-referenced technical inadequacies, the present disclosure provides an SiP module and a method of manufacturing the SiP module.

In one aspect, the present disclosure provides the manufacturing method of the SiP module, including the steps of: welding electronic units required by the SiP module onto a top surface of a Printed Circuit Board (PCB), with welding spots being reserved on a bottom surface of the PCB to obtain a PCB assembly (PCBA) of the SiP module; pasting tightly a functional film on a surface of the electronic units of the PCBA; filling on plastic materials on the top surface of the PCBA, ensuring that the plastic materials cover the electronic units and the functional film on the top surface of the PCBA, and obtaining solidified PCBA after the plastic materials are solidified; and cutting the solidified PCBA to obtain a plurality of the SiP modules.

In certain embodiments, the present disclosure provides the manufacturing method of the SiP module, wherein the functional film includes: a plurality of film units being spaced apart from each other by cutting channels, wherein each of the cutting channels is connected to adjacent ones of the film units and is formed with a hollow portion, and wherein each of the film units corresponds to a respective one of the SiP modules.

In one aspect, the present disclosure provides the SiP module, including: a Printed Circuit Board (PCB) having a top surface with electronic units required by the SiP module provided thereon, and a bottom surface with reserved welding spots provided thereon; and a functional film pasted tightly on a surface of the electronic units, wherein the functional film and the electronic units are covered by plastic materials.

In certain embodiments, the present disclosure provides the SiP module, wherein the functional film possesses electromagnetic shielding function.

Therefore, the manufacturing method of the SiP module according to the present disclosure simultaneously applies plastic sealing on both the functional film that possesses electromagnetic shielding function and the electronic devices, such that the SiP module possesses electromagnetic shielding function after the plastic sealing is done, thereby simplifying the manufacturing process of the SiP module.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the detailed description and the accompanying drawings, in which.

DETAILED DESCRIPTION OF THE EXEMPLARY EMBODIMENTS

Figure 1:
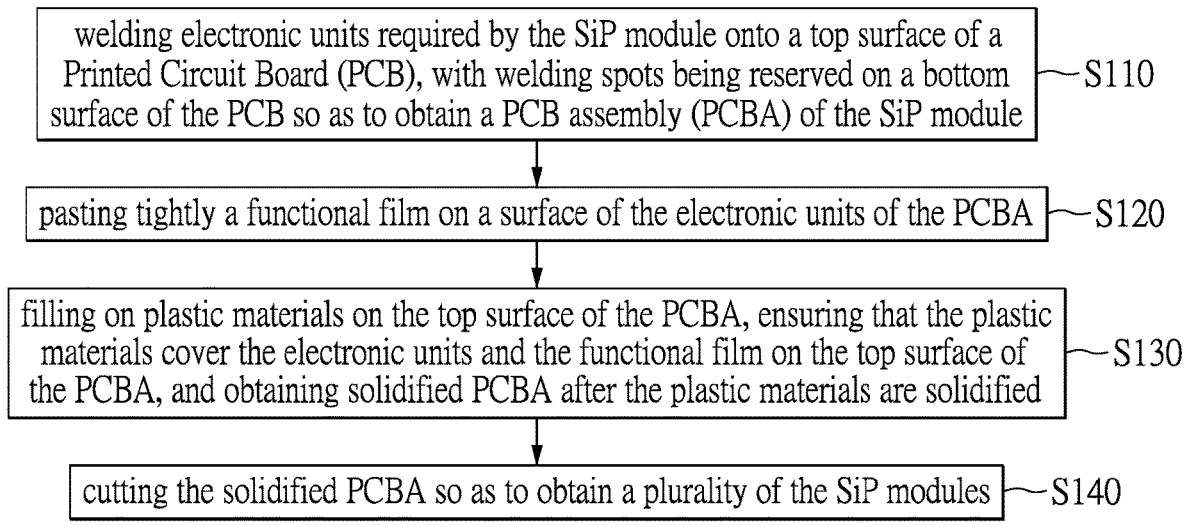
FIG. 1 is a flow chart of an embodiment of a manufacturing method of a system in package (SiP) module according to the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

The present disclosure provides a manufacturing method of a system in package (SiP) module 3 characterized in that the manufacturing method of the SiP module 3 according to an embodiment of the present disclosure, as shown in FIG. 1, includes the following steps of Step S110, Step S120, Step S130 and Step S140.

Step S110: welding electronic units 8 required by the SiP module 3 onto a top surface of a Printed Circuit Board (PCB) 1, with welding spots being reserved on a bottom surface of the PCB 1 so as to obtain a PCB assembly (PCBA) of the SiP module 3.

Step S120: pasting tightly a functional film 9 on a surface of the electronic units 8 of the PCBA.

Step S130: filling on plastic materials 10 on the top surface of the PCBA, ensuring that the plastic materials 10 cover the electronic units 8 and the functional film 9 on the top surface of the PCBA, and obtaining solidified PCBA after the plastic materials 10 are solidified.

Step S140: cutting the solidified PCBA so as to obtain a plurality of the SiP modules 3.

Specifically, in order to improve efficiency of the manufacturing process, a plurality of electronic units 8 required by the SiP module 3 are to be mounted on the PCB 1, and the PCBA is to be plastic-sealed and cut so as to obtain the plurality of the SiP modules 3.

The electronic units 8 are mounted on the PCB using a surface mount technology (SMT) so as to produce the PCBA. After the PCBA is obtained, the functional film 9 is pasted on the surface of the electronic units 8 of the PCBA, for example, the functional film 9 can be pasted on only a top surface of the electronic units 8, or can also be pasted on the top surface and side surfaces of the electronic units 8.

Plastic sealing is applied on the PCBA having the functional film 9 pasted thereon, enabling the plastic materials 10 to cover the electronic units 8 and the functional film 9 on the top surface of the PCBA, and then a solidified PCBA will be obtained after the plastic materials 10 are solidified. After the solidified PCBA is cut, the plurality of the SiP modules 3 will be obtained.

For example, the PCB 1 can be divided into sixteen areas. Each of the areas is configured with one of the SiP modules 3. The electronic units 8 required by the sixteen SiP modules 3 are mounted, in which spaces between areas will be preserved for sake of the subsequent cutting process.

The functional film 9 is produced by adoption of different materials based on actual requirements, such that the functional film 9 has different functions. The present embodiment simultaneously applies plastic sealing on both the functional film 9 possessing electromagnetic shielding function and the electronic devices 8, such that the SiP module 3 can possess electromagnetic shielding function without having to undergo a subsequent metal sputtering process, thereby simplifying the manufacturing process of the SiP module 3. Moreover, the functional films 9 made of different materials enable the SiP module 3 to possess different electromagnetic shielding functions.

Figure 2:
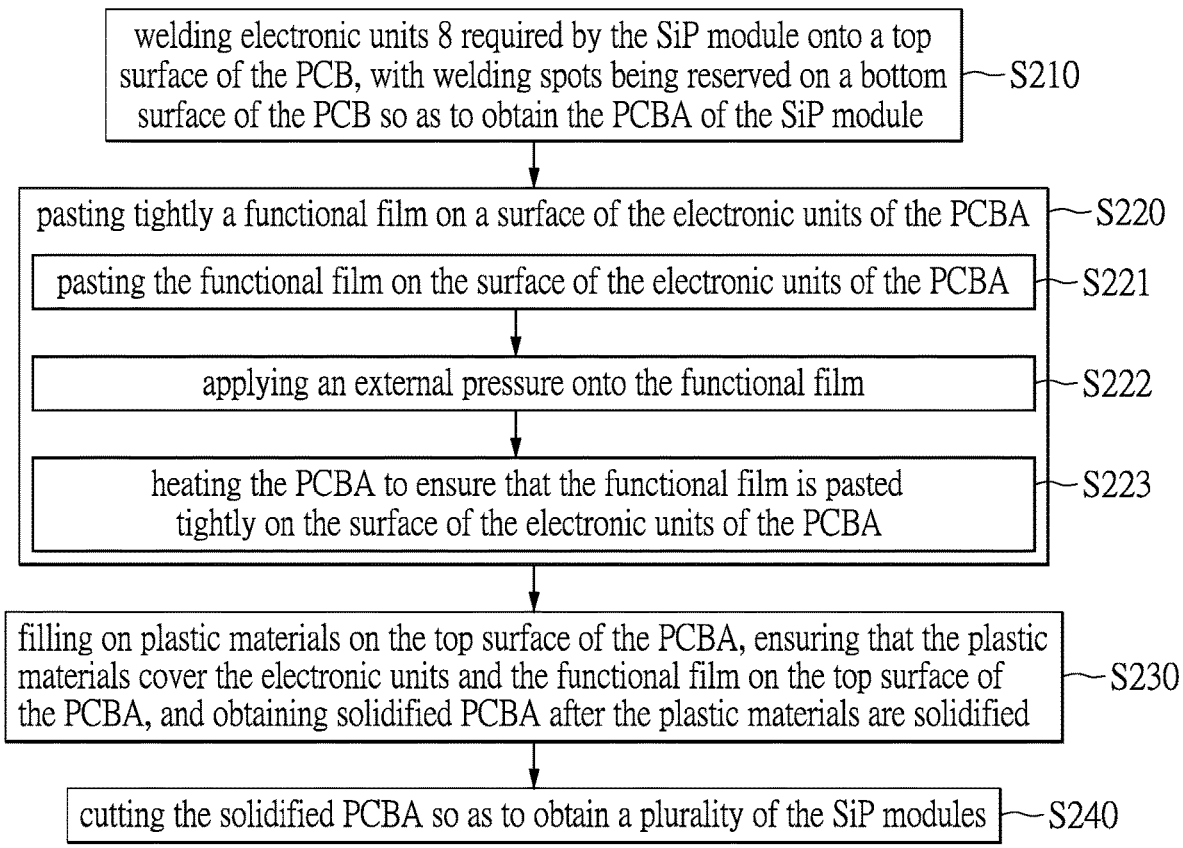
FIG. 2 is a flow chart of another embodiment of the manufacturing method of the SiP module according to the present disclosure.

In another embodiment of the present application, as shown in FIG. 2, the manufacturing method of the SiP module includes the following steps of Step S210, Step S220, Step S230 and Step S240.

Step S210: welding electronic units 8 required by the SiP module 3 onto a top surface of the PCB 1, with welding spots being reserved on a bottom surface of the PCB 1 so as to obtain the PCBA of the SiP module 3.

Step S220: pasting tightly a functional film 9 on a surface of the electronic units 8 of the PCBA.

Step S230: filling on plastic materials 10 on the top surface of the PCBA, ensuring that the plastic materials 10 cover the electronic units 8 and the functional film 9 on the top surface of the PCBA, and obtaining solidified PCBA after the plastic materials 10 are solidified.

Step S240: cutting the solidified PCBA so as to obtain a plurality of the SiP modules 3.

The Step S220 further includes the following steps of Step S221, Step S222 and Step S223.

Step S221: pasting the functional film 9 on the surface of the electronic units 8 of the PCBA.

Step S222: applying an external pressure onto the functional film 9.

Step S223: heating the PCBA to ensure that the functional film 9 is pasted tightly on the surface of the electronic units 8 of the PCBA.

Specifically, when pasting the functional film 9 on the top surface and side surfaces of the electronic units 8 of the PCBA, the size of the functional film 9 is selectable and adjustable to fit the size of the electronic units 8.

Generally, an adhesive layer of the functional film 9 is a glue layer. After the functional film 9 is pasted, a force can be applied from outside of the functional film 9 for pressuring the functional film 9 to be pasted tightly on the surface of the electronic units 8. If the adhesive layer of the functional film 9 is thermosetting glue, the PCBA can be heated to ensure that the functional film 9 is pasted even more tightly on the surface of the electronic units 8 of the PCBA.

The reason that the functional film 9 needs to be pasted tightly on the surface of the electronic units 8 is that a flow pressure generated by the plastic materials 10 during the subsequent plastic sealing process will impact the functional film 9. The flow pressure could even wash away the functional film 9 from the electronic units 8 if the functional film 9 is not pasted tightly on the surface of the electronic units 8, thereby incurring failure to possess electromagnetic shielding functions.

In this embodiment, external pressure and thermosetting are adopted to ensure that the functional film 9 is pasted tightly on the surface of the electronic units 8. Therefore, the SiP module 3 obtained after the plastic sealing can possess a better electromagnetic shielding effect.

Figure 3:
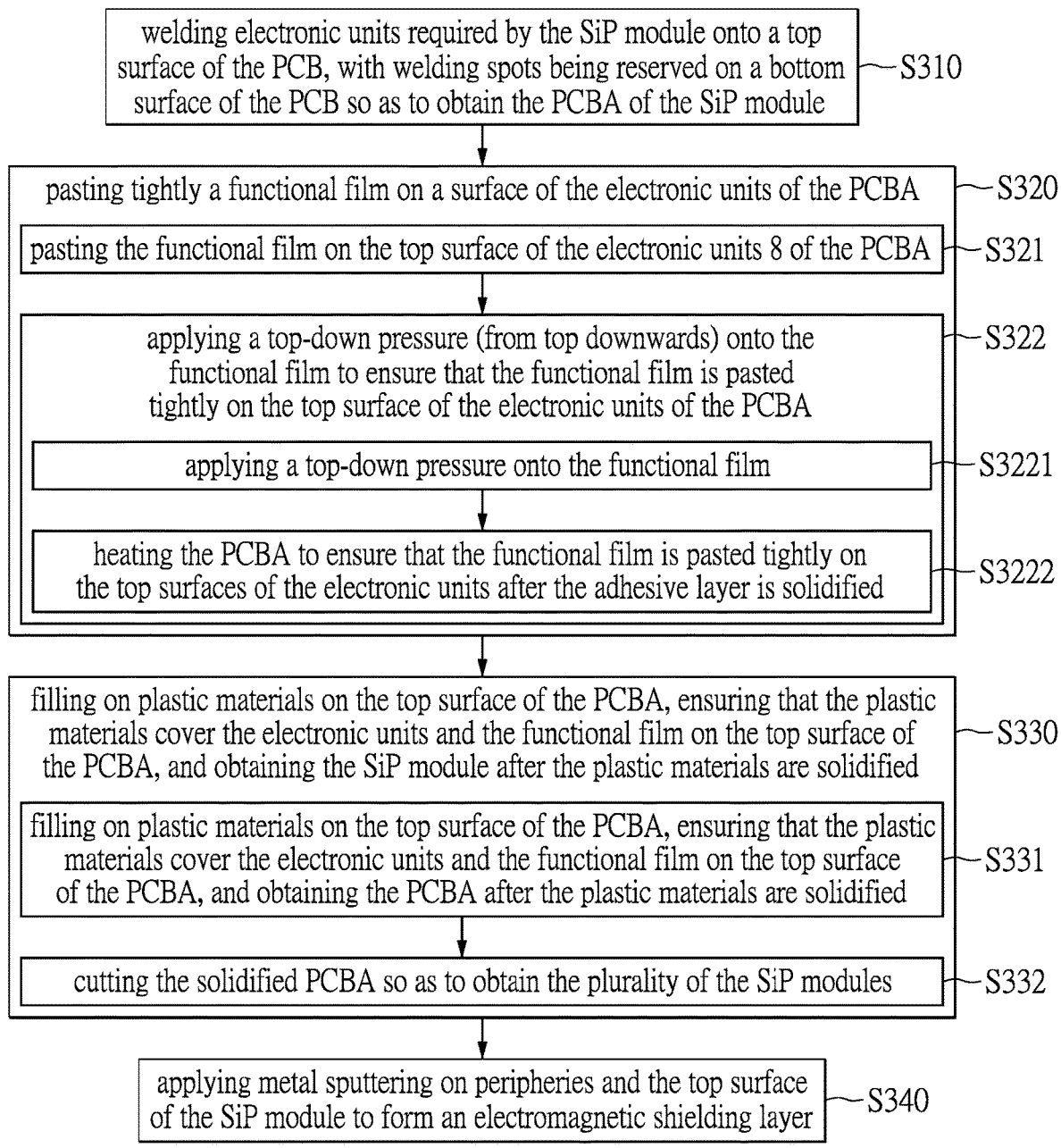
FIG. 3 is a flow chart of yet another embodiment of the manufacturing method of the SiP module according to the present disclosure.
Figure 4:
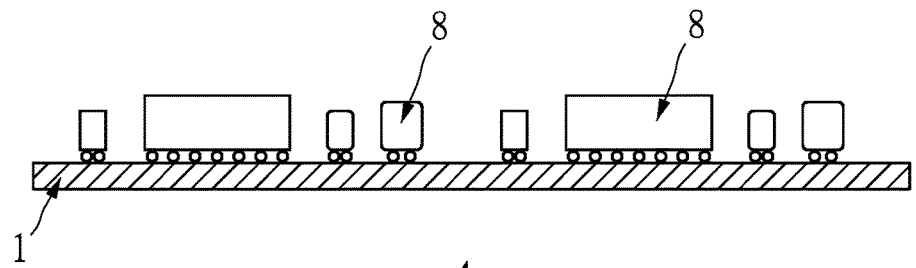
FIGS. 4a-4c are schematic views of a part of a manufacturing process of the SiP module according to the present disclosure.
Figure 4:
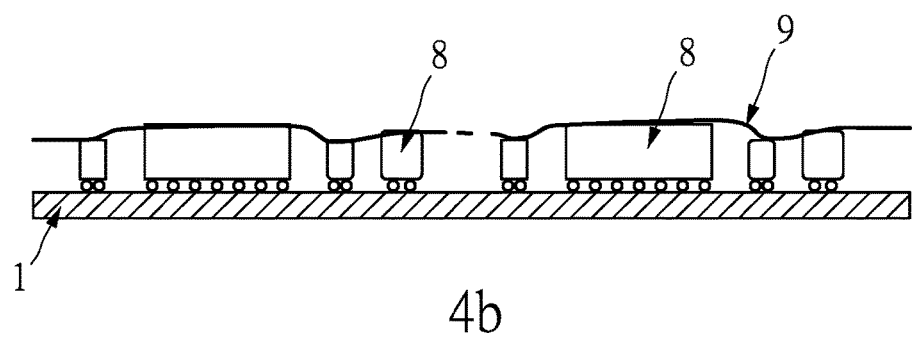
Figure 4:
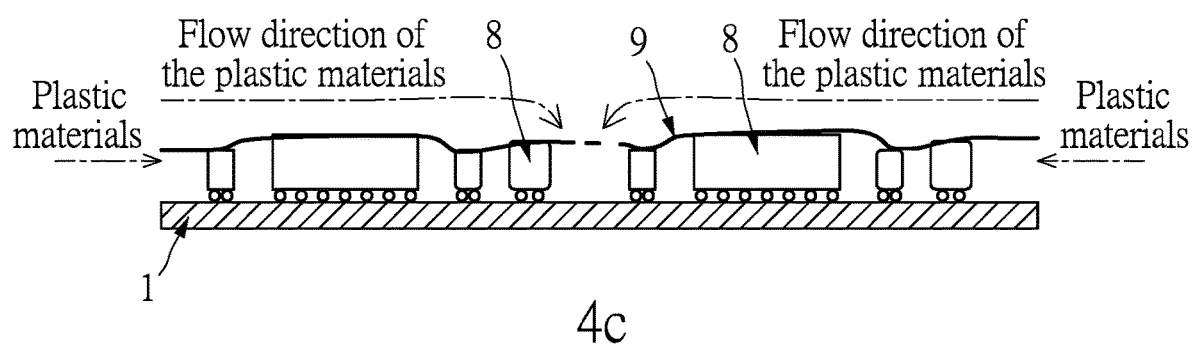
Figure 5:
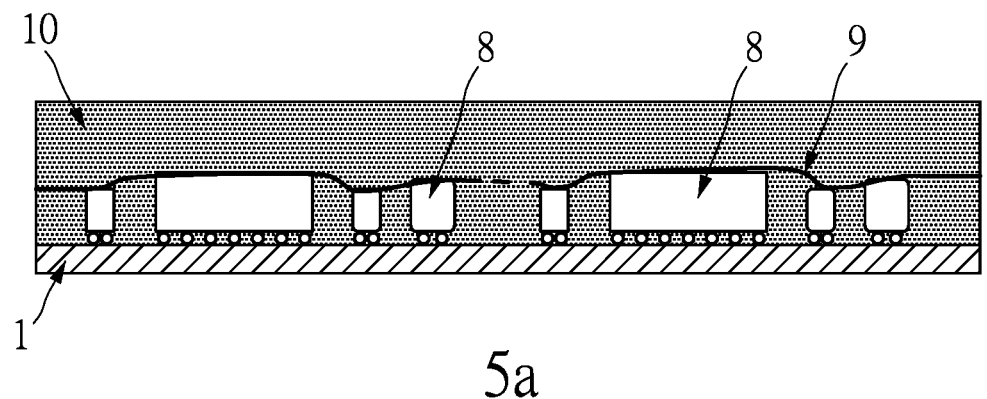
FIGS. 5a-5c are schematic views of another part of the manufacturing process of the SiP module according to the present disclosure.
Figure 5:
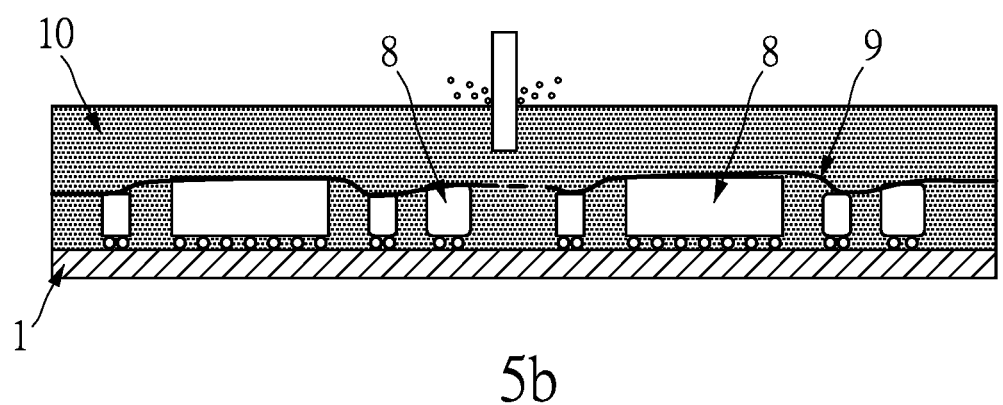
Figure 5:
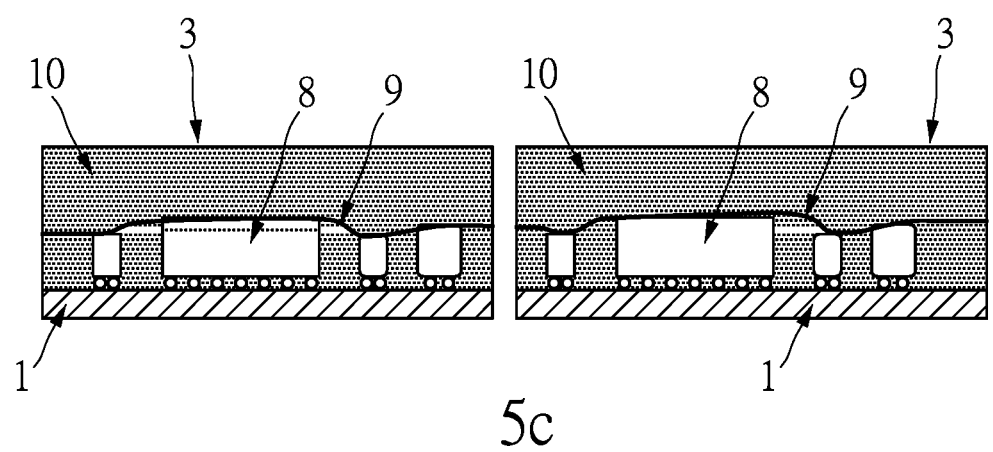

In yet another embodiment of the present application, as shown in FIG. 3 to FIG. 5, the manufacturing method of the SiP module includes the steps of Step S310, Step S320 and Step S330.

Step S310: welding electronic units 8 required by the SiP module 3 onto a top surface of the PCB 1, with welding spots being reserved on a bottom surface of the PCB 1 so as to obtain the PCBA of the SiP module 3, as shown in FIG. 4*a*.

Step S320: pasting tightly a functional film 9 on a surface of the electronic units 8 of the PCBA, as shown in FIG. 4*b*.

Step S330: filling on plastic materials 10 on the top surface of the PCBA, ensuring that the plastic materials 10 cover the electronic units 8 and the functional film 9 on the top surface of the PCBA, and obtaining the SiP module 3 after the plastic materials 10 are solidified.

The Step S330 further includes the following steps of Step S331 and Step S332.

Step S331: filling on plastic materials 10 on the top surface of the PCBA, ensuring that the plastic materials 10 cover the electronic units 8 and the functional film 9 on the top surface of the PCBA, and obtaining the PCBA after the plastic materials 10 are solidified.

FIG. 4*c* shows a process of filling on the plastic materials 10 on the top surface of the PCBA from side surfaces. FIG. 5*a* shows the PCBA after the plastic materials 10 are solidified.

Figure 8:
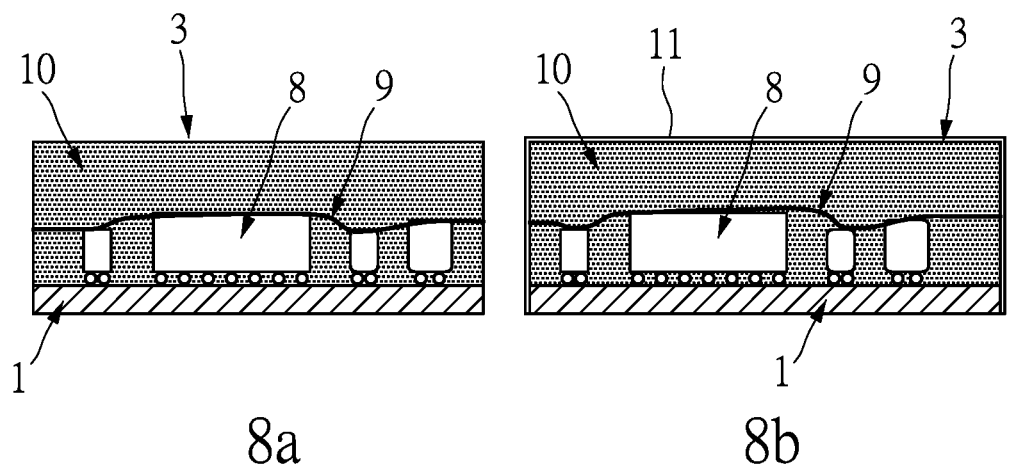
FIGS. 8a-8b are schematic views of the SiP module according to the present disclosure.

Step S332: cutting the solidified PCBA so as to obtain the plurality of the SiP modules 3. FIG. 5*c* shows that two SiP modules 3 are obtained after the solidified PCBA is cut. A single one of the SiP modules 3 is shown in FIG. 8*a*.

The Step S320 further includes the following steps of Step S321 and Step S322.

Step S321: pasting the functional film 9 on the top surface of the electronic units 8 of the PCBA.

Step S322: applying a top-down pressure (from top downwards) onto the functional film 9 to ensure that the functional film 9 is pasted tightly on the top surface of the electronic units 8 of the PCBA, as shown in FIG. 4*b*.

Specifically, considering that the electronic units 8 may have uneven heights or different sizes, pasting the functional film 9 on each of the side surfaces of the electronic units 8 may require significant effort. Therefore, pasting the functional film 9 only on the top surface of the electronic units 8 is a more convenient alternative.

When pasting the functional film 9 on the top surface of the electronic units 8, it may be applicable to paste only one piece of the functional film 9 on all of the electronic units 8 to cover the entire PCBA. In other words, the size of the functional film 9 would need to conform with that of the PCBA to covers all of the electronic units 8 on the PCBA at once. Naturally, in other embodiment of the present disclosure, pasting multiple pieces of the functional films 9 to respectively cover the each of the SiP modules 3 of the PCBA may also be applicable. In other words, each of functional film 9 has a size that respectively conforms to each of the SiP modules 3 of the PCBA. When the functional film 9 is pasted only on the top surface of the electronic units 8, the top-down pressure (from top downwards) can be applied onto the functional film 9 due to uneven height and different size of the electronic units 8, so as to ensure that the functional film 9 is pasted tightly on each of the top surfaces of the electronic units 8 of the PCBA. Applying a top-down pressure onto the functional film 9 to ensure that the functional film 9 is pasted tightly on the top surface of the electronic units 8 of the PCBA may be adapted to the one piece of the functional film 9 and the multiple pieces of the functional films 9.

For example, the functional film 9 can be a deformable material. Heat-resistant foam can be placed on the top of the functional film 9 after the deformable functional film 9 is pasted on the top surfaces of the electronic units 8. After that, a heavy weight can be placed on the top of the heat-resistant foam for pressing the heat-resistant foam and the deformable functional film 9 to cause deformation thereof, which enables the functional film 9 to be pasted more tightly onto the top surfaces of the electronic units 8 having different heights.

By virtue of applying the top-down pressure to ensure that the functional film 9 is pasted tightly on the top surfaces of the electronic units 8, the chance of the functional film 9 being washed away from the electronic units 8 is decreased during the plastic sealing process, thereby improving a yield rate of the products.

In other embodiments of the present application, if the adhesive layer of the functional film 9 is thermosetting glue, the Step S322 further includes the following steps of Step S3221 and Step S3222.

Step S3221: applying a top-down pressure onto the functional film 9.

Step S3222: heating the PCBA to ensure that the functional film 9 is pasted tightly on the top surfaces of the electronic units 8 after the adhesive layer is solidified.

Selectively, the manufacturing method of the SiP module 3 can further include Step S340: applying metal sputtering on peripheries and the top surface of the SiP module 3 to form an electromagnetic shielding layer.

Specifically, in cases where multiple effects of the electromagnetic shielding are required at the same time, the functional film 9 and metal sputtering may be jointly applied to produce the SiP modules 3.

For instance, if electromagnetic shielding is required to shield against both the radio frequency (RF) signals with low frequency band and the RF signals with medium-high frequency band, the functional film 9 and metal sputtering may both be applied. For example, the functional film 3 made of ferric oxide material for absorbing the RF signals with low frequency band can be pasted on the top surfaces of the electronic units 8. Afterwards, the PCBA is plastic-sealed and cut for obtaining the SiP modules 3. Then, the metal sputtering is applied on the peripheries and the top surface of the SiP module 3 to form the electromagnetic shielding layer that is capable of absorbing the RF signals with medium-high frequency band. As a result, the SiP modules 3 may simultaneously guard against both the RF signals with low frequency band and the RF signals with medium-high frequency band.

Figure 7:
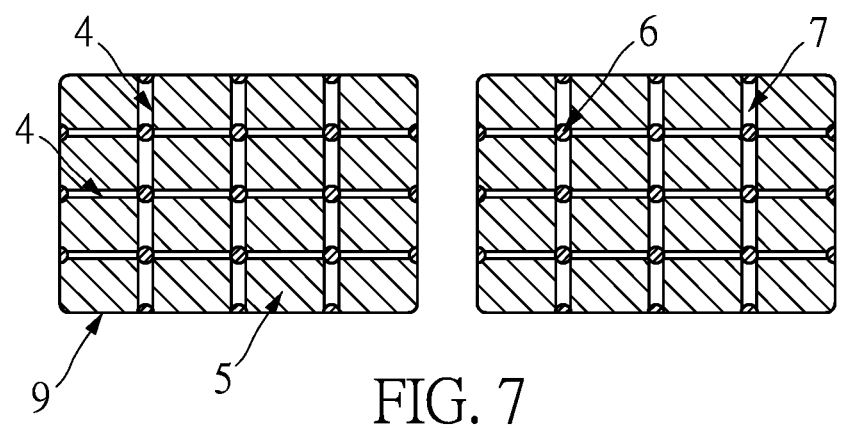
FIG. 7 is a schematic view of a functional film designed for the SiP module area according to the present disclosure.

The functional film 9 of the present disclosure is shown in FIG. 7 to include a plurality of film units 5 spaced apart from each other by cutting channels 4, in which each of the cutting channels 4 is connected to adjacent ones of the film units 5 and is formed with a hollow portion, and each of the film units corresponds to a respective one of the SiP modules 3.

Figure 6:
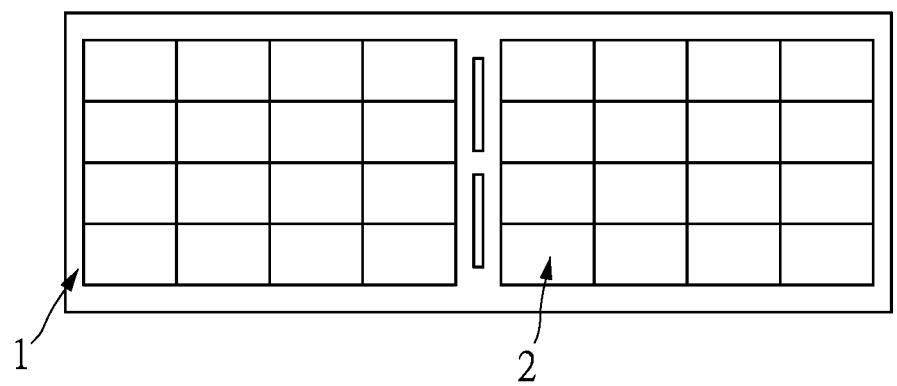
FIG. 6 is a schematic view of the SiP module area on a printed circuit board of two connected boards according to the present disclosure.

Specifically, FIG. 7 shows a pair of the same functional films 9 designed to correspond respectively to the SiP module areas on the PCB 1 of two connected boards shown in FIG. 6. The left one of the functional films 9 is taken for example as follows.

The functional film 9 generally includes a glue layer and a functional layer. The functional layer is positioned on a top surface of the glue layer. The functional layer is attached on the surface of the electronic units 8 via the glue layer.

Preferably, the functional film 9 is designed to correspond in size to the PCBA. The functional film 9 includes the plurality of the film units 5, in which each of the film units corresponds in size to the respective one of the SiP module areas 2 on the PCBA. The plurality of film units 5 are spaced apart from each other by the cutting channels 4. After the plastic sealing is completed, the PCBA is cut along the cutting channels 4 on the PCB 1 (i.e., the cutting channels 4 of the functional film 9), and the SiP modules 3 are obtained. In order to prevent the functional film 9 from being pasted onto the cutting blades (incurring metal burrs) during the cutting process, the cutting channels 4 are configured with the hollow portions. In other words, parts of the cutting channels 4 are connected to the film units 5, and parts of the cutting channels 4 are configured with the hollow portions. By such configuration, the functional film 9 is configured to include the plurality of the film units 5 and is easy to be pasted directly onto the PCBA that has the plurality of the SiP module areas 2. Thus, the manufacturing process of the SiP modules 3 is simplified.

By virtue of the hollow portions of the cutting channels 4, the functional film 9 is less likely to be pasted onto the cutting blades during the cutting process. Moreover, the functional film 9 is configured by the hollow portions to include the plurality of the film units 5, which makes the functional film 9 easy to be preserved.

In other embodiments of the present disclosure, the cutting channels 4 include a plurality of horizontal cutting channels and a plurality of vertical cutting channels. Each of the horizontal cutting channels is formed with the hollow portion that is independent from each of the vertical cutting channels. Each of the vertical cutting channels is formed with a hollow portion that is independent from each of the horizontal cutting channels. Each of the horizontal cutting channels intersects with each of the vertical cutting channels at an intersect area 6 that is connected to adjacent ones of the film units.

Specifically, the intersect area 6 expands from the center of an intersection of the horizontal cutting channel and the vertical cutting channel to form an area with a certain size, said center being co-located with a center of the intersect area 6. The remaining parts of the cutting channels 4 other than the intersect areas 6 are regarded as the hollow areas 7.

The size of the intersect areas 6 is configurable based on actual requirements, and the shape of the intersect areas 6 is also not limited, as long as the adjacent film units 5 can be connected via the intersect areas 6.

For example, the intersect area 6 can be a circular area having a predetermined radius (e.g., 20 μm), while the other areas of the cutting channels 4 are the hollow areas 7.

The hollow areas 7 of the cutting channels 4 of the functional film in this embodiment can be configured at different positions of the cutting channels 4. Moreover, the size and shape of the hollow areas 7 can be various.

In other embodiment of the present disclosure, as shown in FIG. 8a, the SiP module 3 includes the PCB 1 and the functional film 9.

The PCB 1 has the top surface with electronic units 8 required by the SiP module 3 provided thereon, and the bottom surface with reserved welding spots (not shown) provided thereon.

The functional film 9 is pasted tightly on the surface of the electronic units 8. The functional film 9 and the electronic units 8 are covered by plastic materials 10.

Selectively, the top surfaces of the electronic units 8 can be pasted tightly with the functional film 9 that possesses electromagnetic shielding function. Again, in consideration of uneven heights and different sizes of the electronic units 8, pasting the functional film 9 on each of the side surfaces of the electronic units 8 may require significant effort. Therefore, pasting the functional film 9 only on the top surface of the electronic unit 8 is a more convenient alternative. Since the SiP module 3 is pasted by the functional film 9 that possesses electromagnetic shielding function, the manufacturing process can be further simplified.

Preferably, the peripheries and the top surface of the plastic materials 10 are configured with the electromagnetic shielding layer 11 as shown in FIG. 8b.

Specifically, the electromagnetic shielding layer 11 configured on peripheries and the top surface of the plastic materials 10 can be made by multiple techniques, such as metal sputtering, pasting metal film, and configuring electromagnetic shielding mask.

In conclusion, compared with the conventional techniques, the SiP module and the manufacturing method of the SiP module according to the present disclosure have beneficial effects of: applying plastic sealing on both the functional film that possesses electromagnetic shielding function and the electronic devices simultaneously, such that the SiP module possesses electromagnetic shielding function after the plastic sealing is done, thereby simplifying the manufacturing process of the SiP module. Furthermore, the manufacturing method of the SiP module can be combined with the metal sputtering process, thereby improving the effect of electromagnetic shielding of the SiP module.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A manufacturing method of a system in package (SiP) module, comprising the steps of:
    welding electronic units required by the SiP module onto a top surface of a Printed Circuit Board (PCB), and having welding spots being reserved on a bottom surface of the PCB to obtain a PCB assembly (PCBA) of the SiP module via a surface mount technology;

pasting tightly a functional film on a surface of the electronic units of the PCBA; filling on plastic materials on the top surface of the PCBA, ensuring that the plastic materials cover the electronic units and the functional film on the top surface of the PCBA, and obtaining solidified PCBA after the plastic materials are solidified; and cutting the solidified PCBA to obtain a plurality of the SiP modules;

applying metal sputtering on a periphery and a top surface of the SiP module to form an electromagnetic shielding layer; and wherein the functional film includes: a plurality of film units being spaced apart from each other by cutting channels, wherein each of the cutting channels is connected to adjacent ones of the film units and is formed with a hollow portion, and wherein each of the film units corresponds to a respective one of the SiP modules.

2. The manufacturing method according to claim 1, wherein the step of pasting tightly the functional film on the surface of the electronic units of the PCBA further includes:

pasting the functional film on the surface of the electronic units of the PCBA;

applying an external pressure onto the functional film; and heating the PCBA to ensure that the functional film is pasted tightly on the surface of the electronic units of the PCBA.

3. The manufacturing method according to claim 1, wherein the step of pasting tightly the functional film on the surface of the electronic units of the PCBA further includes:

pasting the functional film on a top surface of the electronic units of the PCBA; and applying a top-down pressure onto the functional film to ensure that the functional film is pasted tightly on the top surface of the electronic units of the PCBA.

4. The manufacturing method according to claim 3, wherein the step of applying the top-down pressure onto the functional film to ensure that the functional film is pasted tightly on the top surface of the electronic units of the PCBA further includes:

applying the top-down pressure onto the functional film; and heating the PCBA until the plastic materials are solidified to ensure that the functional film is pasted tightly on the surface of the electronic units of the PCBA.

5. The manufacturing method according to claim 1, wherein the functional film includes: a plurality of film units being spaced apart from each other by cutting channels, wherein each of the cutting channels has a portion connected to adjacent ones of the film units and is formed with a hollow portion, and wherein each of the film units corresponds to a respective one of the SiP modules.

6. The manufacturing method according to claim 5, wherein:

the cutting channels include horizontal cutting channels and vertical cutting channels; and each of the horizontal cutting channels is formed with the hollow portion that is independent from each of the vertical cutting channels, each of the vertical cutting channels is formed with a hollow portion that is independent from each of the horizontal cutting channels, each of the horizontal cutting channels intersects with each of the vertical cutting channels to form the portion that is connected to adjacent ones of the film units.

\* \* \* \* \*